United States Patent
Ooi et al.

(10) Patent No.: US 6,773,828 B1
(45) Date of Patent: Aug. 10, 2004

(54) SURFACE PREPARATION TO ELIMINATE WHISKER GROWTH CAUSED BY PLATING PROCESS INTERRUPTIONS

(75) Inventors: Heng Ee Ooi, Penang (MY); Salmi Abdul Rahman, Kedah (MY); Chin Yee Fong, Penang (MY); Siew Leong Chaw, Penang (MY)

(73) Assignee: ASE Electronics (M) Sdn. Bhd., Penang (MY)

( * ) Notice: Subject to any disclaimer, the term of this patent is extended or adjusted under 35 U.S.C. 154(b) by 0 days.

(21) Appl. No.: 10/418,619

(22) Filed: Apr. 18, 2003

(51) Int. Cl.[7] ............... B32B 15/20; C25D 5/10; C25D 7/00; H01L 23/495

(52) U.S. Cl. .......... 428/647; 428/935; 205/170; 205/176

(58) Field of Search ............... 428/646, 647, 428/648, 674, 675, 935; 205/170, 176, 122

(56) References Cited

U.S. PATENT DOCUMENTS

| | | | |
|---|---|---|---|
| 4,589,962 A | 5/1986 | Sajja et al. | |
| 4,707,724 A | * 11/1987 | Suzuki et al. | 257/677 |
| 5,069,979 A | * 12/1991 | Nakajima et al. | 428/644 |
| 5,320,737 A | 6/1994 | Chao et al. | |
| 5,454,929 A | * 10/1995 | Kinghorn | 205/128 |
| 5,750,016 A | 5/1998 | Moon | |
| 6,083,633 A | * 7/2000 | Fister et al. | 428/615 |
| 6,469,386 B1 | 10/2002 | Lee et al. | |
| 6,518,508 B2 | 2/2003 | Park et al. | |
| 6,583,500 B1 | * 6/2003 | Abbott et al. | 257/666 |
| 2002/0187364 A1 | * 12/2002 | Heber et al. | 428/648 |
| 2003/0186597 A1 | * 10/2003 | Suzuki et al. | 439/886 |

* cited by examiner

*Primary Examiner*—John J. Zimmerman
(74) *Attorney, Agent, or Firm*—David T. Millers

(57) ABSTRACT

An electroplating process reduces the whisker formation rate that results from an interruption of the electroplating process for an alloy. The process forms a tin strike or a thin layer of a pure(>99.9%) metal on the alloy during an activation operation, so that an interruption in the electroplating process during which the lead frame or other work piece remains in an activation solution etches the pure metal layer rather than the alloy and thus does not unacceptably roughen the surface of the work piece. An exemplary embodiment forms a tin strike on a predominantly copper lead frame during an activation operation and forms an Sn—Pb solder layer on the tin strike during a plating operation. The solder layer is generally more than five times as thick as the tin strike layer.

19 Claims, 3 Drawing Sheets

SURFACE PREPARATION TO ELIMINATE WHISKER GROWTH CAUSED BY PLATING PROCESS INTERRUPTIONS

BACKGROUND

Integrated circuit manufacturing and packaging processes commonly employ electroplating to deposit metal layers on conductive parts. A lead frame, for example, made of a copper alloy may be plated with a layer of solder to facilitate soldering or wire bonding to the lead frame during an integrated circuit packaging process.

A reliable electroplating process for a lead frame or another electronic component generally requires several preparatory processes before a plating operation deposits metal. An activation process, for example, is commonly used to prepare the surface of the work piece (e.g., a lead frame) for electroplating. For the activation process, the work piece is connected to a power supply and placed in a solution containing an activation chemical such as an acid. An electrolysis process can then clean and otherwise prepare the surface of the work piece to accept a uniform electroplated layer.

The actual plating operation conventionally places the prepared work piece into a solution and connects the work piece to the negative pole of a DC power supply. As a result, the work piece acts as a cathode in the solution. An electrode connected to the positive pole of the power supply is also placed in the solution and acts as an anode. The solution and/or the anode contain the metal or metals (as ion or neutral atoms) that will be plated onto the work piece when the power supply drives a current from the anode to the cathode through the solution. The current includes positive metal ions in the solution that flow to the work piece where the metal ions pick up electrons and become neutral atoms attached to the surface of the work piece.

The quantity of metal deposited on the work piece during the plating operation depends on the amount of current through the work piece. As a result, the electroplating operation generally deposits more metal in areas where current concentrations are higher. At sharp high points on rough surfaces, the high current concentration can cause growth of whiskers of the plated metal. Such whiskers are undesirable on lead frames since the whiskers can cause electrical shorting and/or visible defects.

A controlled electroplating of a lead frame having a smooth surface can avoid unacceptable whisker formation. However, when the plating process is interrupted, for example, by a mechanical breakdown or for any other reasons, a batch of lead frames that was in the electroplating equipment during the process interruption is found to have a higher than normal incidence of whisker formation after completion of the plating process. In particular, leaving work pieces in an activation solution during a process interruption can roughen the surfaces of work pieces, which leads to whisker formation. A stoppage of 30 minutes, for example, during plating of a batch of lead frames can significantly reduce the yield of good parts.

In view of these difficulties, processes and structures that provide a high yield of good quality parts even after an interruption of a plating process are sought.

SUMMARY

In accordance with an aspect of the invention, a device such as a lead frame made of an alloy receives a protective strike of a metal having a high purity, preferably more than 99.9% pure. Pure tin (Sn), for example, can be plated on a copper alloy lead frame during an activation process. The lead frame can subsequently be plated with solder or another metal using conventional electroplating techniques. In event of an interruption of the electroplating process, the strike of pure metal interacts evenly with activation chemicals to preserve the smooth surfaces of the lead frame. Accordingly, formation of whiskers is avoided when the plating process resumes.

One specific embodiment of the invention is an electroplating process for a metal alloy work piece such a lead frame made predominantly of copper. The process includes placing the work piece in an activation solution containing an activation chemical and a plating chemical and running a current through the work piece and the activation solution to deposit a layer of a pure metal (e.g., a tin strike) on a surface of the alloy during an activation operation. In the event of an interruption of the electroplating process, the activation solution etches the pure metal causing less surface roughening than would etching of the alloy. After the activation operation, the process electroplates a solder (e.g., Sn—Pb) layer over the pure metal on the surface of the alloy.

The pure metal layer, which serves to protect the work piece during process interruptions, can be much thinner than the solder layer, so that the pure metal layer minimally affects soldering, electrical, and other characteristics of the plated work piece. The solder layer may, for example, be five or more times the thickness of the pure metal layer. Specifically, the layer of pure metal may have a thickness less than about 2.0 $\mu$m, while the solder layer has a thickness that is more than about 10 $\mu$m.

Another specific embodiment of the invention is a lead frame including a body made of an alloy of a metal such as copper, a pure metal plating on the alloy, and a solder plating on the pure metal plating. The pure metal plating can be a tin strike that provides a base when the solder plating is made of tin and lead. The solder plating is generally much thicker than the pure metal layer to provide the lead frame with good soldering characteristics. The solder layer can be five or more times thicker than the pure metal plating. In one specific case, the solder plating has a thickness that is more than about 10 $\mu$m, while the pure metal plating has a thickness less than about 2.0 $\mu$m.

BRIEF DESCRIPTION OF THE DRAWINGS

Use of the same reference symbols in different figures indicates similar or identical items.

DETAILED DESCRIPTION

Figure 1A:
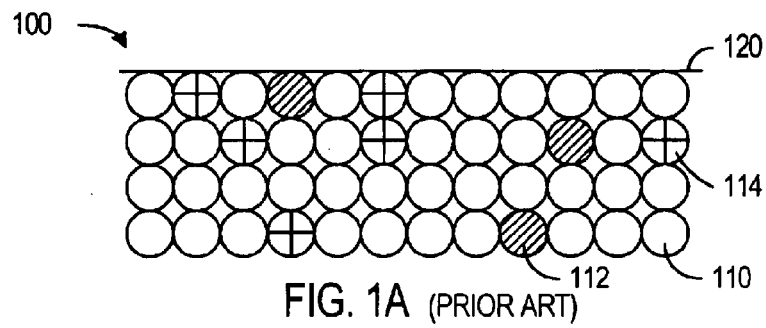
FIGS. 1A, 1B, and 1C are a cross-sectional view of a work piece surface during a conventional plating process that is subject to increased whisker formation caused by plating process interruptions.
Figure 1B:
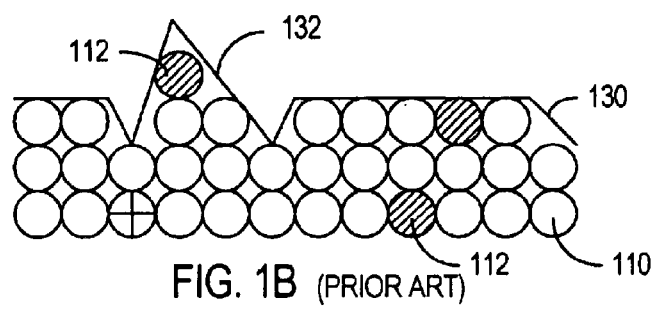
Figure 1C:
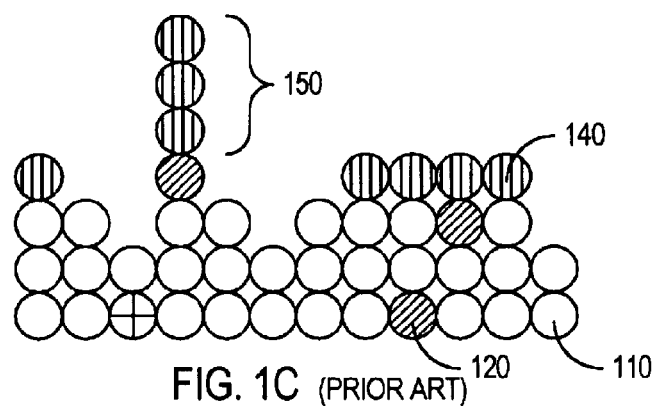

In accordance with an aspect of the invention, a thin layer of tin or another pure metal on a work piece such as a lead frame can prevent whisker formation that results from an interruption of a plating process. FIGS. 1A, 1B, and 1C illustrate a whisker formation mechanism that can be prevented by the thin coating (e.g., tin strike). The thin layer or "strike" is a uniform, fine grain coating with minimum acceptable thickness that can be deposited through electrodeposition to protect the work piece from attack when in a chemical solution.

FIG. 1A schematically illustrates a surface portion of a part such as a lead frame containing an alloy 100. Alloy 100 contains several different atomic species 110, 112, and 114 and may be, for example, a copper alloy containing copper atoms 110 and impurities 112 and 114. Such impurities are generally added to copper to improve a characteristic such as the hardness of the alloy. Alloy 100 has a surface 120 that is smooth, so that the current during an electroplating process has a uniform current density across surface 120.

If the plating process is interrupted, the activation chemicals in a solution surrounding alloy 100 can act on and roughen the surface of alloy 100. FIG. 1B schematically illustrates a rough surface 130 that results when the activation solution has a lower reactivity to some impurity atoms 112 than to copper atoms 110 and/or when the activation solution has a higher reactivity to other impurity atoms 114 than to copper atoms 110. The differences in reactivity cause removal of the copper and impurity atoms at different rates, creating sharp peaks 132 on surface 130.

When the process resumes, a high current density flows at peaks 132 on the roughened surface during an electroplating operation, so that plated atoms 140 tend to collect at peaks 132 forming a whisker 150 as illustrated in FIG. 1C.

Figure 2:
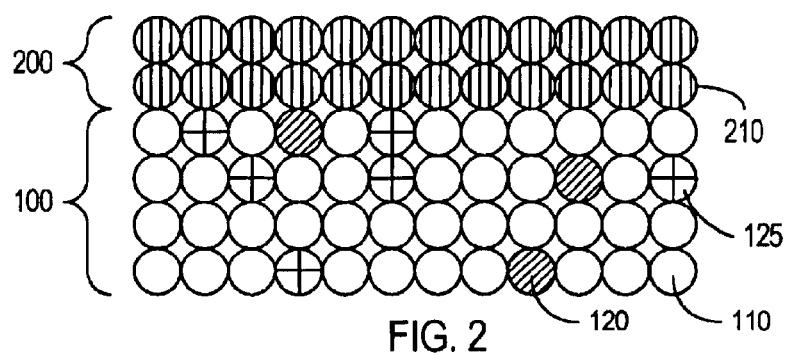
FIG. 2 shows a cross-sectional view of a portion of an alloy work piece having a pure metal layer that protects the work piece from surface roughening that could otherwise occur during an interruption of a plating process.

FIG. 2 schematically illustrates an alloy 100 having a thin layer 200 of a pure metal coated onto the smooth surface 120 of an alloy 100. Layer 200, which can be a tin layer or a tin strike, prevents or reduces surface roughening during an interruption in a plating process because the metal in layer 200 is pure and is evenly removed by the active chemical in the solution. Accordingly, the surface of the structure of FIG. 2 remains smooth as long as the structure remains in the solution for a time less than that required for the active chemical to remove layer 200.

Figure 3:
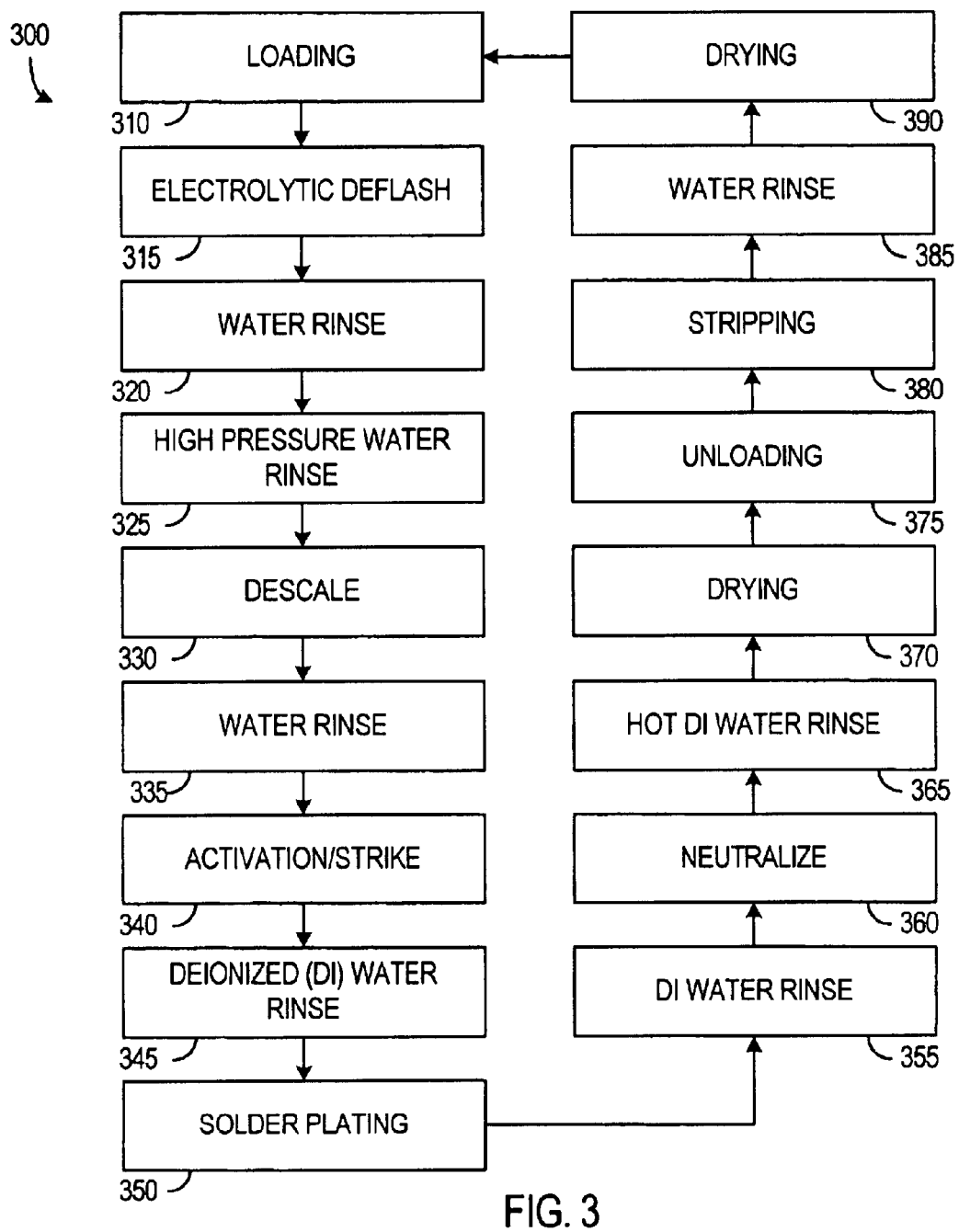
FIG. 3 is a flow diagram of a plating process in accordance with an embodiment of the invention.

FIG. 3 is a flow diagram of an exemplary electroplating process 300 in accordance with an embodiment of the invention. Process 300 can be conducted using conventional electroplating equipment such as the electroplating equipment that is commercially available from suppliers such as AEM, Inc. of San Diego, Calif. and Technic, Inc. of Cranston, R.I., Such electroplating equipment generally mounts work pieces on a conveyor belt or another transportation mechanism that moves the work pieces to a series of stations where the operations that make up process 300 are performed. At each station, the work pieces can be rinsed or dipped in a solution with or without a current being applied. Specific process parameters, solution compositions, process steps, and the process order, which are described here to explain one implementation of the invention, can be modified and changed as required for the electroplating equipment employed.

Process 300 begins with a loading operation 310 that loads a batch of work pieces into the electroplating equipment. The work pieces are made of a material such as copper or a copper alloy that may contain impurities. In an exemplary embodiment, the work pieces are lead frames that are molded from copper alloy. Table 1 lists the chemical composition of some commercially available materials for such copper lead frames. Each of the materials listed in Table 1 contains impurities that to one degree or another lead to whisker formation if the materials are left in an activation solution during an interruption of electroplating process 300.

TABLE 1

| Material | Chemical Composition (%) | | | | | | | | |
|---|---|---|---|---|---|---|---|---|---|
| | Cu | Fe | P | Zn | Zr | Ni | Si | Mg | Sn |
| OLIN 151 | 99.90 | — | — | — | 0.10 | — | — | — | — |
| OLIN 194 | 96.90 | 2.35 | 0.63 | 0.12 | — | — | — | — | — |
| C 7025 | 96.91 | — | — | — | — | 2.50 | 0.47 | 0.12 | — |
| MF 202 | 97.56 | — | 0.03 | — | — | 0.19 | — | — | 2.00 |

The loaded work pieces are transported to a station for an electrolytic deflash operation 315 that removes mold flash. During deflash operation 315, the work pieces are immersed in an alkaline solution such as a solution of sodium carbonate ($Na_2CO_3$), trisodium phosphate ($Na_3PO_4$), and potassium hydroxide (KOH). The chemical action of the alkaline solution and electrolysis from an applied current weakens the flash on the work pieces. As a result, the flash falls off the work pieces either in deflash operation 315 or during subsequent rinse operation 320 or high-pressure rinse operation 325.

A descale operation 330 removes contamination such as oxides that may have formed on the surfaces of the work pieces. A descaling solution of 30–70% of a hydroxycarboxylic acid in combination with an applied current, for example, can effectively remove such contaminations from copper lead frames. A rinse operation 335 removes the descaling solution from the work pieces.

A combined activation and strike operation 340 prepares the surface of the work pieces for subsequent electroplating of solder. Generally, operation 340 uses an activation solution for a catholic electrochemical process that removes oxide films and activates the work pieces by producing freshly exposed base materials. In accordance with an aspect of the invention, plating chemical is added to the activation solution so that operation 340 also deposits a thin layer or strike of a pure metal. However, the activation solution has a low concentration plating chemicals when compared to an electroplating solution that serves to conduct electroplating process with high speed deposition uniform, fine grain alloy coating. Additionally, the current density for the activation process has a constant setting that is applicable for all packages in order to get minimum/optimum strike thickness. In contrast, the current applied for solder plating will differ for different packages designs.

An exemplary embodiment of activation/strike operation 340 adds a tin compound to the primary additive of the activation solution and thus deposits tin (Sn) on the work pieces. Materials other than tin may also be suitable for the thin layer formed during activation/strike operation 340, but pure tin is readily available and provides a good base for subsequent electroplating of a tin-lead (Sn—Pb) solder. For one specific embodiment of the invention, Solderon Tin Concentrate, which is commercially available from Shipley Company, LLC of Marlborough, Mass., at a concentration between 290 g/l and 310 g/l is added to an activation solution containing 20–30% methane sulfonic acid (MSA or $CH_3SO_3H$). The current of 40 amps at 5 volts during the exemplary activation/strike operation 340 leaves about 30 to 80 microinches (i.e., about 0.75 to 2.0 $\mu$m) of 99.98% pure tin on the surfaces of the work pieces.

The thin layer of pure metal, even before being completely plated, gives the work pieces surfaces having uniform reactivity with the activation solution. Accordingly, an interruption in electroplating process 300, which leaves the work pieces in the activation solution for up to about 1 hour or more, does not roughen the surface of the work pieces enough to produce the rate of whisker formation found in processes that do not form a tin strike.

A de-ionized water rinse operation 345 removes the activation solution and readies the work pieces for solder electroplating operation 350. The solder electroplating can be conducted using conventional techniques. In the exemplary embodiment of the invention, solder electroplating operation 350 uses a solution of tin (Sn) and lead (Pb) ions in the appropriate proportions to plate solder of a desired composition onto the work pieces.

One specific embodiment of solder electroplating operation 350 uses methane sulfonic acid, Solderon Tin Concentrate, Solderon Lead Concentrate, Solderon Sc—N Primary, and Solderon Anti-Oxidant to achieve a solution containing Solderon Tin Concentrate at about 300 g/l, Stanum Sulfonic 20–30%, Solderon Lead Concentrate at about 450 g/l, and lead methanesulfonate 40–50%. Solder electroplating operation 350 for this chemistry leaves a layer of Sn—Pb solder that is about 89% tin. The duration of electroplating operation 350 is controlled to provide a solder layer about 400 to 600 microinches (i.e., about 10 and 15 μm) thick on the work pieces.

Once the work pieces are solder plated, a de-ionized water rinse operation 355, a neutralizing operation 360, and a hot de-ionized water rinse 365 remove and neutralize the plating solution or other undesirable chemicals from the surfaces of the work pieces. An alkaline solution containing 50% potassium hydroxide and 10% trisodium phosphate serves to neutralize any residual of the acidic electroplating solution described above. The work pieces are then dried in operation 370 and unloaded in operation 375.

After unloading of the work pieces, a stripping operation 380 removes any solder plated onto the fixtures or belt of the equipment on which the work pieces were mounted. A solution of nitric acid (about 68%), thiocarbamide, and methane sulfonic acid serves to strip Sn—Pb solder from the equipment. The equipment is then rinsed in operation 385 and dried in operation 390 to ready the equipment for loading of another batch of work pieces.

The voltage, current, process times, processing steps, and processing order of electroplating processes in accordance with embodiments of the invention will generally depend on the type of equipment employed. Tables 2 and 3 summarize processing steps and some of process parameters respectively for electroplating equipment from AEM, Inc. and electroplating equipment from Technic, Inc. Differences in Tables 2 and 3 particularly illustrate some of the variation of process flows arising from differences in equipment. In particular, different types of electroplating equipment often implement different rinsing techniques and cleaning processes.

TABLE 2

Process parameters for AEM Electroplating Equipment

| Station | Immersion Time (sec) | Current (Ampere) | Voltage (Volt) |
|---|---|---|---|
| Electrolytic Deflash | 42.0 | 200.0 | 5.0 |
| Cold Water Rinse I | 6.0 | — | — |
| High Pressure Rinse | 28.0 | — | — |
| Descale | 64.0 | 30.0 | 5.0 |
| Activation/Strike | 32.0 | 70.0 | 5.0 |
| DI Water Rinse | 10.0 | — | — |
| Plating | 68.0 | 215.0 | 5.0 |
| Neutralizing | 23.0 | — | — |
| Hot DI Water Rinse | 18.0 | — | — |
| Stripping | 56.0 | 100 | 1.5 |

TABLE 3

Process Parameters for Technic Electroplating Equipment

| Station | Immersion Time (sec) | Current (Ampere) | Voltage (Volt) |
|---|---|---|---|
| Electrolytic Deflash | 53.0 | 200.0 | 5.13 |
| Water Rinse I | 9.0 | — | — |
| High Pressure Rinse | 21.0 | — | — |
| Descale | 40.0 | 20.0 | 3.0 |
| Rinse | 7.0 | — | — |
| Activation/Strike | 16.0 | 32.0 | 4.6 |
| DI Water Rinse | 6.0 | — | — |
| Plating | 35.0 | 112.0 | 4.0 |
| Dual Rinse | 14.0 | — | — |
| Neutralizing | 8.0 | — | — |
| Hot DI Water Rinse | 7.0 | — | — |
| Air Knife | 9.0 | — | — |

Figure 4:
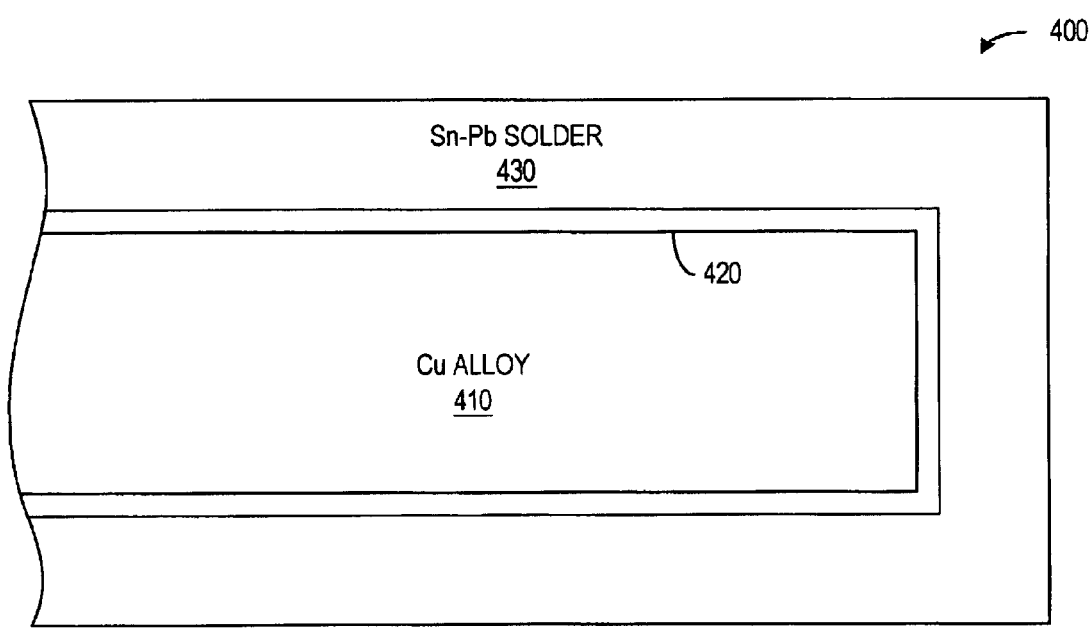
FIG. 4 is a cross-sectional view of a portion of a lead frame including a tin strike that protected the lead frame from surface roughening that could have otherwise occur during an interruption of a plating process.

A lead frame with both a tin strike and a solder layer formed in accordance with the exemplary embodiment of the invention is found to have characteristics such as solderability and adhesion of the plated layers to the lead frame that match those of lead frames having only electroplated solder layers. FIG. 4 shows a cross-sectional view of a portion of a lead frame 400, which includes a copper alloy body 410, a tin strike 420, and a plated Sn—Pb solder layer 430.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. An electroplating process comprising:
   placing a work piece containing an alloy, into an activation solution that contains an activation chemical and a plating chemical;
   running a current through the work piece and the activation solution to deposit a layer of a pure metal on a surface of the alloy, wherein the pure metal is tin; and
   electroplating a solder layer over the pure metal on the surface of the alloy.

2. The process of claim 1, wherein the pure metal is more than 99.9% pure.

3. The process of claim 1, wherein the layer of the pure metal serves to prevent roughening of the surface of the alloy when the work piece is left in the activation solution as a result of an interruption in the process.

4. The process of claim 1, wherein the alloy predominantly contains copper.

5. The process of claim 1, wherein the solder layer comprises tin alloyed with another metal.

6. The process of claim 1, wherein the work piece comprises a lead frame.

7. The process of claim 1, wherein the layer of pure metal has a thickness less than about 2.0 µm.

8. The process of claim 7, wherein the solder layer has a thickness that is more than about 10 µm.

9. The process of claim 1, wherein:

running a current through the work piece and the activation solution to deposit the layer of the pure metal occurs in a first station of electroplating equipment; and electroplating the solder layer occurs at a second station of the electroplating equipment.

10. A process for electroplating a solder on a lead frame, comprising:

placing the lead frame in an activation solution that also contains a plating chemical;

running a current through the lead frame and the activation solution to activate a surface of the lead frame and simultaneously deposit a layer of a pure metal on the surface of the lead frame, wherein the layer of a pure metal is tin;

placing the lead frame in a plating solution; and running a current through to plate a solder layer on the layer of the pure metal.

11. The process of claim 10, wherein the pure metal is more than 99.9% pure.

12. The process of claim 10, wherein the solder layer comprises tin alloyed with another metal.

13. The process of claim 10, wherein the lead frame comprises a copper alloy.

14. A lead frame comprising:

a body made of a copper alloy;

a tin strike electroplated on the copper alloy; and a solder electroplated on the tin strike.

15. The lead frame of claim 14, wherein the tin strike is more than 99.9% pure tin.

16. The lead frame of claim 14, wherein the solder comprises tin alloyed with another metal.

17. The lead frame of claim 14, wherein the tin strike has a thickness less than about 2.0 µm.

18. The lead frame of claim 17, wherein the solder has a thickness that is more than about 10 µm.

19. The lead frame of claim 17, wherein the solder is at least five times thicker than the tin strike.

* * * * *